US012660210B2

(12) United States Patent
    Jiang et al.

(10) Patent No.: US 12,660,210 B2
(45) Date of Patent: Jun. 16, 2026

(54) TRENCH CAPACITOR STRUCTURE AND METHODS OF MANUFACTURING

(71) Applicant: Taiwan Semiconductor Manufacturing Company, Ltd., Hsinchu (TW)

(72) Inventors: Yu Jiang, Hsinchu (TW); Ming-Hsun Lin, Hsinchu City (TW); Lee-Chuan Tseng, New Taipei City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 453 days.

(21) Appl. No.: 18/297,282

(22) Filed: Apr. 7, 2023

(65) Prior Publication Data

US 2024/0096930 A1      Mar. 21, 2024

Related U.S. Application Data

(60) Provisional application No. 63/376,358, filed on Sep. 20, 2022.

(51) Int. Cl.
| *H10D 1/00* | (2025.01) |
| *H10D 1/66* | (2025.01) |
| *H10D 1/68* | (2025.01) |
| *H10P 50/24* | (2026.01) |

(52) U.S. Cl.
CPC ............. *H10D 1/042* (2025.01); *H10D 1/665* (2025.01); *H10D 1/716* (2025.01); *H10P 50/242* (2026.01)

(58) Field of Classification Search
CPC ........ H10D 1/665; H10D 1/047; H10D 1/711; H10D 1/712; H10D 1/716; H10D 1/042; H10B 12/038; H10B 12/37
See application file for complete search history.

(56) References Cited

U.S. PATENT DOCUMENTS

| 6,284,666 B1 * | 9/2001 | Naeem | ................ H01L 21/3065 257/E21.232 |
| 6,780,337 B2 * | 8/2004 | Goldbach | ......... H01L 21/30655 216/2 |
| 2023/0009146 A1 * | 1/2023 | Jo | .......................... H10D 1/716 |

* cited by examiner

*Primary Examiner* — Jose R Diaz
(74) *Attorney, Agent, or Firm* — Harrity & Harrity, LLP

(57)            ABSTRACT

Some implementations described herein include a deep trench capacitor structure and methods of formation. The deep trench capacitor structure may penetrate vertically into a silicon substrate. In some implementations, formation of the deep trench capacitor structure includes forming segments of a deep trench capacitor recess using a combination of in-situ oxidation/nitridation, ex-situ deposition, and reactive ion etching techniques. By forming the deep trench capacitor recess using the in-situ oxidation/nitridation operation, the ex-situ deposition, and the reactive ion etching techniques, a deep trench capacitor structure may be formed that meets target critical dimensions and has an aspect ratio of approximately 50:1.

20 Claims, 15 Drawing Sheets

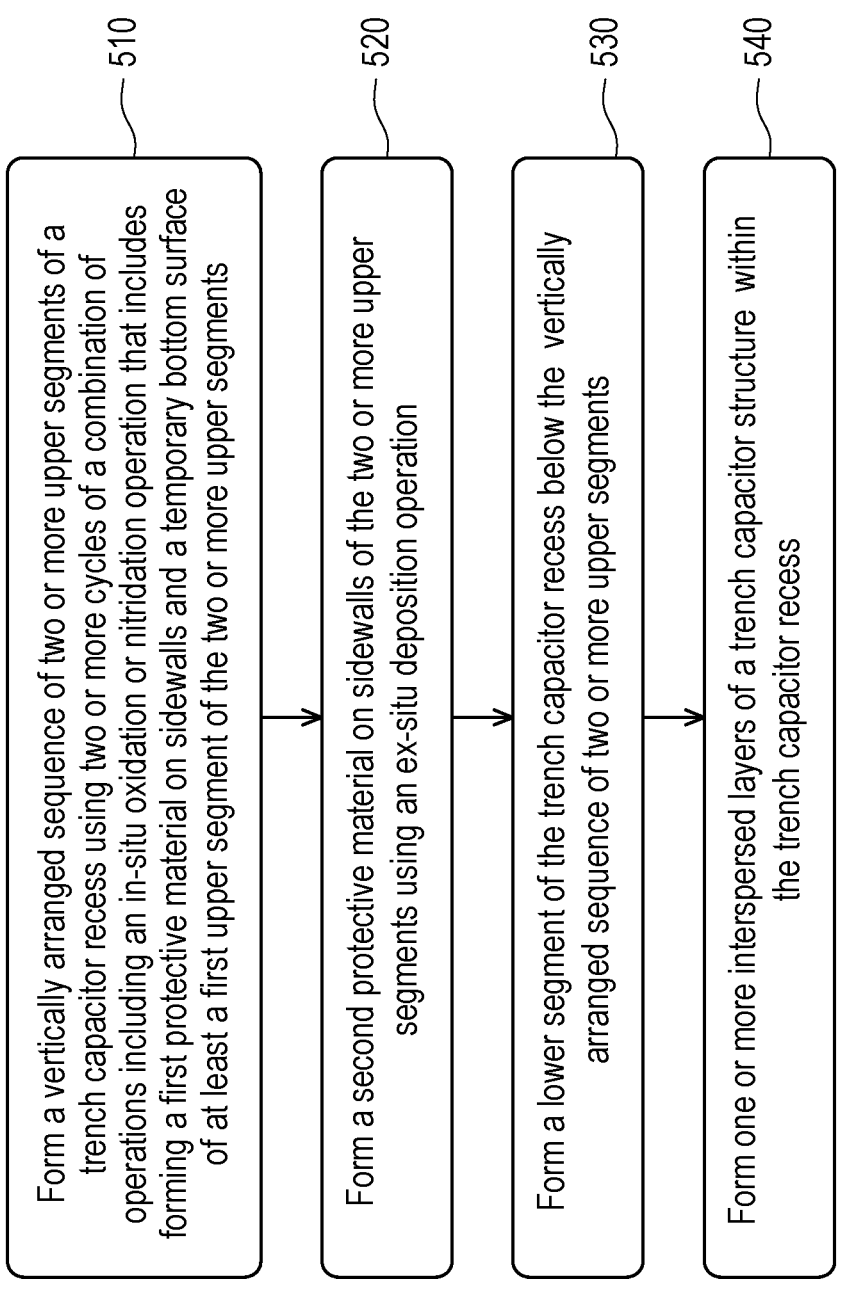

510 — Form a vertically arranged sequence of two or more upper segments of a trench capacitor recess using two or more cycles of a combination of operations including an in-situ oxidation or nitridation operation that includes forming a first protective material on sidewalls and a temporary bottom surface of at least a first upper segment of the two or more upper segments 520 — Form a second protective material on sidewalls of the two or more upper segments using an ex-situ deposition operation 530 — Form a lower segment of the trench capacitor recess below the vertically arranged sequence of two or more upper segments 540 — Form one or more interspersed layers of a trench capacitor structure within the trench capacitor recess

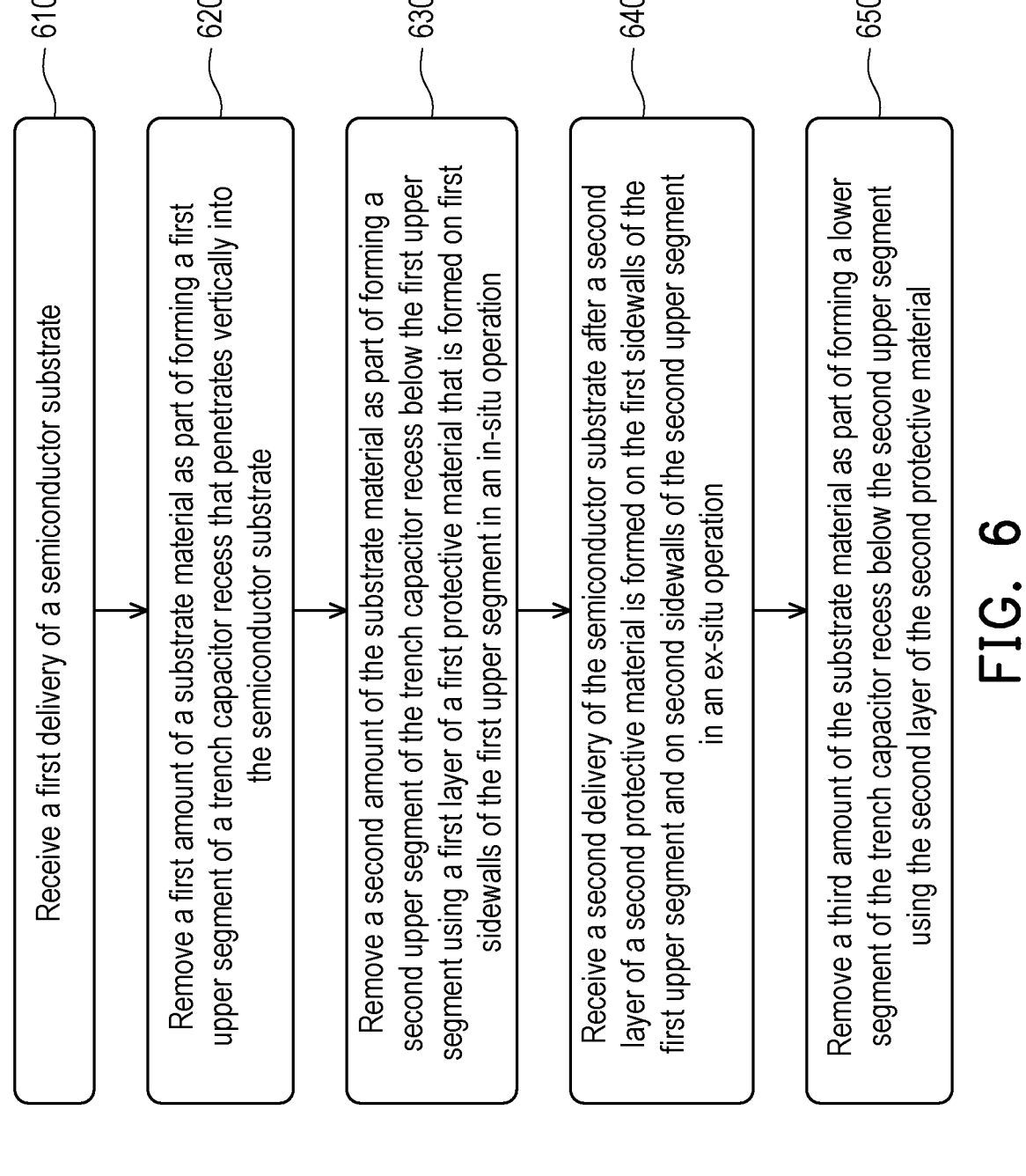

600

610 Receive a first delivery of a semiconductor substrate

620 Remove a first amount of a substrate material as part of forming a first upper segment of a trench capacitor recess that penetrates vertically into the semiconductor substrate 630 Remove a second amount of the substrate material as part of forming a second upper segment of the trench capacitor recess below the first upper segment using a first layer of a first protective material that is formed on first sidewalls of the first upper segment in an in-situ operation 640 Receive a second delivery of the semiconductor substrate after a second layer of a second protective material is formed on the first sidewalls of the first upper segment and on second sidewalls of the second upper segment in an ex-situ operation 650 Remove a third amount of the substrate material as part of forming a lower segment of the trench capacitor recess below the second upper segment using the second layer of the second protective material

FIG. 6

TRENCH CAPACITOR STRUCTURE AND METHODS OF MANUFACTURING

CROSS-REFERENCE TO RELATED APPLICATION

This Patent Application claims priority to Provisional Patent Application No. 63/376,358 filed on Sep. 20, 2022, and entitled "Trench Capacitor Structure and Methods of Manufacturing". The disclosure of the prior Application is considered part of and is incorporated by reference into this Patent Application.

BACKGROUND

An integrated circuit (IC) device may include a trench capacitor structure. The trench capacitor structure may be formed in a recess that penetrates vertically into a semiconductor substrate. The trench capacitor structure may include layers of a conductive material interspersed with layers of a dielectric material.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3I are diagrams of an example manufacturing process used to fabricate a device including the trench capacitor structure described herein.

FIGS. 5 and 6 are flowcharts of example processes associated with forming the trench capacitor structure described herein.

DETAILED DESCRIPTION

Figure 1:
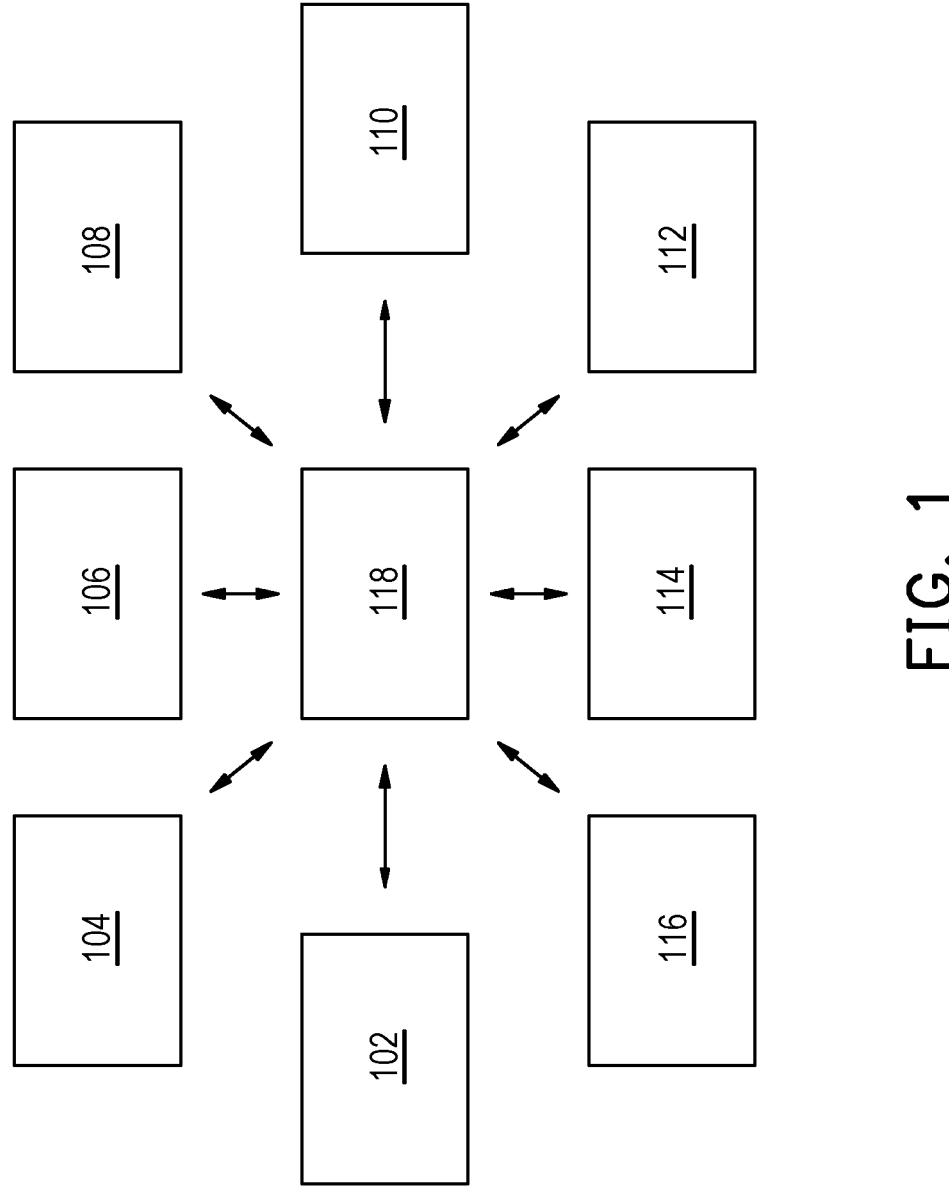
FIG. 1 is a diagram of an example environment in which systems and/or methods described herein may be implemented.
Figure 1:

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, techniques to form a deep trench capacitor structure may include multiple cycles of an in-situ deposition operation that forms a protective film on surfaces of a segments used to form a deep trench capacitor recess (e.g., sidewall surfaces and a bottom surface of the segments). The in-situ deposition operation may alternate with, a combination of in-situ etching operations that include a first etching operation to remove the protective film from the bottom surface of a segment and a second etching operation that removes silicon to add another segment and/or increase a depth of the deep trench capacitor recess.

During each etching operation, a first portion of ions of an etchant will disperse to the protective film on the sidewall surfaces of the segment, while a second portion of ions of the etchant will disperse to the bottom surface of the segment. As a depth of the deep trench capacitor recess increases, and due to an increasing aspect ratio of the deep trench capacitor recess, a ratio of the second portion of ions to the first portion of ions will decrease, resulting in an increased amount of lateral etching. This is due to the isotropic properties of the etch operation. The protective film is used on the sidewall surfaces to negate some of the effects of the isotropic properties of the etch operation so as to enable an anisotropic etch of the deep trench capacitor recess.

The semiconductor industry has pushed to make advances in the depth of deep trench capacitors so as to increase the amount of charge that can be stored in the deep trench capacitors and, therefore, the capacitance of the deep trench capacitors. However, the isotropic properties of the etch operation(s) used to form the recess for the deep trench capacitor results in tradeoffs that may limit the ability to increase the depth of the recess. For example, using a thicker protective film enables deeper etching due to more material on the sidewalls that prevents a width of an upper portion of the recess from unnecessarily increasing. However, a tradeoff is that etch times through a bottom portion of the protective film to deepen the trench capacitor recess increase, thereby resulting in a narrower opening in the bottom film and a reduced width (e.g., a bottom critical dimension or CD) of the deep trench capacitor recess. Alternatively, using a thinner protective film enables the deep trench capacitor recess to be etched deeper while achieving a larger bottom width (e.g., less shrinkage in the bottom CD). However, a tradeoff is that the thinner protective film on the sidewalls is less protective and etched quickly, resulting in an increased width of the upper portion of the recess (e.g., an upper CD) and causing a line spacing between deep trench capacitor recesses to be reduced. These tradeoffs result from the isotropic properties of the etch operation described above.

Some implementations described herein include a deep trench capacitor structure and methods of formation. The deep trench capacitor structure may penetrate vertically into a silicon substrate. In some implementations, formation of the deep trench capacitor structure includes forming segments of a deep trench capacitor recess using a combination of in-situ oxidation or nitridation, ex-situ deposition, and reactive ion etching (RIE) techniques. For example, an in-situ etch operation may be performed to form a first segment of the deep trench capacitor recess, followed by an in-situ oxidation/nitridation operation to form a protective film on surfaces of the first segment. These operations are referred to as "in-situ" in that the in-situ etch operation and the in-situ oxidation/nitridation operation are performed in the same processing. Another etch operation may be performed to etch through the protective film on the bottom surface of the first segment, followed by a further etch operation to form a second segment of the deep trench capacitor recess under the first segment, thereby extending the depth of the deep trench capacitor recess. The preceding sequence of operations may be performed for one or more cycles until a particular depth for the deep trench capacitor recess is achieved, at which point a different sequence of operations may be performed to further increase the depth of the deep trench capacitor recess without causing excessive etching into the sidewalls of the deep trench capacitor recess, which would otherwise unnecessarily increase the width or critical dimension of the deep trench capacitor recess. The next sequence of operations includes the ex-situ deposition of another protective film along the sidewalls and the bottom surface of the deep trench capacitor recess, an etch operation to etch through the protective film on the bottom surface, and another etch operation to further increase the depth of the deep trench capacitor recess while the protective film protects the sidewalls of the deep trench capacitor recess from being laterally etched.

By forming the deep trench capacitor recess using the in-situ oxidation operation, ex-situ deposition, and RIE techniques, a deep trench capacitor structure may be formed that meets target critical dimensions and has an aspect ratio of approximately 50:1. In this way, an electrical performance of an IC device may be improved relative to another IC device including another deep trench capacitor structure formed using another technique that excludes the ex-situ deposition operation. Additionally, and due to a reduction in etch times, resources used to form the deep trench capacitor structure may be reduced relative to resources used not using the ex-situ deposition operation and improve an overall efficiency of fabricating the deep trench capacitor structure.

FIG. 1 is a diagram of an example environment 100 in which systems and/or methods described herein may be implemented. As shown in FIG. 1, environment 100 may include a plurality of semiconductor processing tools 102-116 and a wafer/die transport tool 118. The plurality of semiconductor processing tools 102-116 may include a deposition tool 102, an exposure tool 104, a develop tool 106, an etch tool 108, a planarization tool 110, a plating tool 112, a pre-treatment tool 114, a plasma tool 116, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, a low-pressure CVD (LPCVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the deposition tool 102 includes an epitaxial tool that is configured to form layers and/or regions of a device by epitaxial growth. In some implementations, the example environment 100 includes a plurality of types of deposition tools 102.

The exposure tool 104 is a semiconductor processing tool that is capable of exposing a photoresist layer to a radiation source, such as an ultraviolet (UV) light source (e.g., a deep UV light source, an extreme UV (EUV) light source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The develop tool 106 is a semiconductor processing tool that is capable of developing a photoresist layer that has been exposed to a radiation source to develop a pattern transferred to the photoresist layer from the exposure tool 104. In some implementations, the develop tool 106 develops a pattern by removing unexposed portions of a photoresist layer. In some implementations, the develop tool 106 develops a pattern by removing exposed portions of a photoresist layer. In some implementations, the develop tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, a reactive ion etch (RIE) took, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

In some implementations, the etch tool 108 may include deposition capabilities. In such implementations, the etch tool 108 may be used to form features in a semiconductor substrate (e.g., a recess or a vertical interconnect access structure, among other examples) with a high aspect ratio (e.g., a width to depth ratio of approximately 50:1, among other examples). To form the features with such an aspect ratio, the etch tool 108 may perform an in-situ oxidation/nitridation that results in formation or growth of a layer of a protective material on sidewalls and a bottom surface of a cavity (e.g., a recess) in the semiconductor substrate. The in-situ oxidation/nitridation, and resulting growth of the protective material, may occur during and/or as part of a plasma-flush operation that is performed in the processing chamber of the etch tool 108 after an in-situ deposition operation. Forming the features with such an aspect ratio may further include a sequence of etch operations that include the etch tool 108 selectively etching the protective material from the bottom surface of the cavity, followed by the etch tool 108 etching material from the semiconductor substrate below the cavity.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The pre-treatment tool 114 is a semiconductor processing tool that is capable of using various types of wet chemicals and/or gasses to treat the surface of one or more layers of a device in preparation for one or more subsequent semiconductor processing operations. For example, the pre-treatment tool 114 may include a chamber in which a device may be placed. The chamber may be filled with a wet chemical and/or a gas that is used to modify the physical and/or chemical properties of one or more layers of a device.

The plasma tool 116 is a semiconductor processing tool, such as a decoupled plasma source (DPS) tool, an inductively coupled plasma (ICP) tool, a transformer coupled plasma (TCP) tool, or another type of plasma-based semiconductor processing tool, that is capable of treating the surface of one or more layers of a device using a plasma. For example, the plasma tool 116 may sputter etch or otherwise remove material from the surface of a layer of a device using plasma ions.

Wafer/die transport tool 118 includes a mobile robot, a robot arm, a tram or rail car, an overhead hoist transport (OHT) system, an automated materially handling system (AMHS), and/or another type of device that is configured to transport substrates and/or semiconductor devices between semiconductor processing tools 102-116, that is configured to transport substrates and/or semiconductor devices between processing chambers of the same semiconductor processing tool, and/or that is configured to transport substrates and/or semiconductor devices to and from other locations such as a wafer rack, a storage room, and/or the like. In some implementations, wafer/die transport tool 118 may be a programmed device that is configured to travel a particular path and/or may operate semi-autonomously or autonomously. In some implementations, the environment 100 includes a plurality of wafer/die transport tools 118.

For example, the wafer/die transport tool 118 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 118 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations). In these implementations, the wafer/die transport tool 118 is configured to transport substrates and/or semiconductor devices between the processing chambers of the deposition tool 102 without breaking or removing a vacuum (or an at least partial vacuum) between the processing chambers and/or between processing operations in the deposition tool 102, as described herein.

As described in connection with FIGS. 2A-6, and elsewhere herein, the one or more semiconductor processing tools 102-116 may perform a series of manufacturing operations. The series of manufacturing operations includes forming a vertically arranged sequence of two or more upper segments of a trench capacitor recess using two or more cycles of a combination of operations. The combination of operations includes an in-situ oxidation/nitridation operation that includes forming a first protective material on sidewalls and a temporary bottom surface of at least a first upper segment of the two or more upper segments. The series of manufacturing operations includes forming a second protective material on sidewalls of the two or more upper segments using an ex-situ deposition operation. The series of manufacturing operations includes forming a lower segment of the trench capacitor recess below the vertically arranged sequence of two or more upper segments. The series of manufacturing operations includes forming one or more interspersed layers of a trench capacitor structure within the trench capacitor recess.

Additionally, or alternatively, a tool (e.g., the etch tool 108) may perform a series of operations. The series of operations includes receiving, by the tool, a first delivery of a semiconductor substrate. The series of operations includes removing, by the tool, a first amount of a substrate material as part of forming a first upper segment of a trench capacitor recess that penetrates vertically into the semiconductor substrate. The series of operations includes removing, by the tool, a second amount of the substrate material as part of forming a second upper segment of the trench capacitor recess below the first upper segment using a first layer of a first protective material that is formed on first sidewalls of the first upper segment in an in-situ operation. The series of operations includes receiving, by the tool, a second delivery of the semiconductor substrate after a second layer of a second protective material is formed on the first sidewalls of the first upper segment and on second sidewalls of the second upper segment in an ex-situ operation. The series of operations includes removing, by the tool, a third amount of the substrate material as part of forming a lower segment of the trench capacitor recess below the second upper segment using the second layer of the second protective material.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2A:
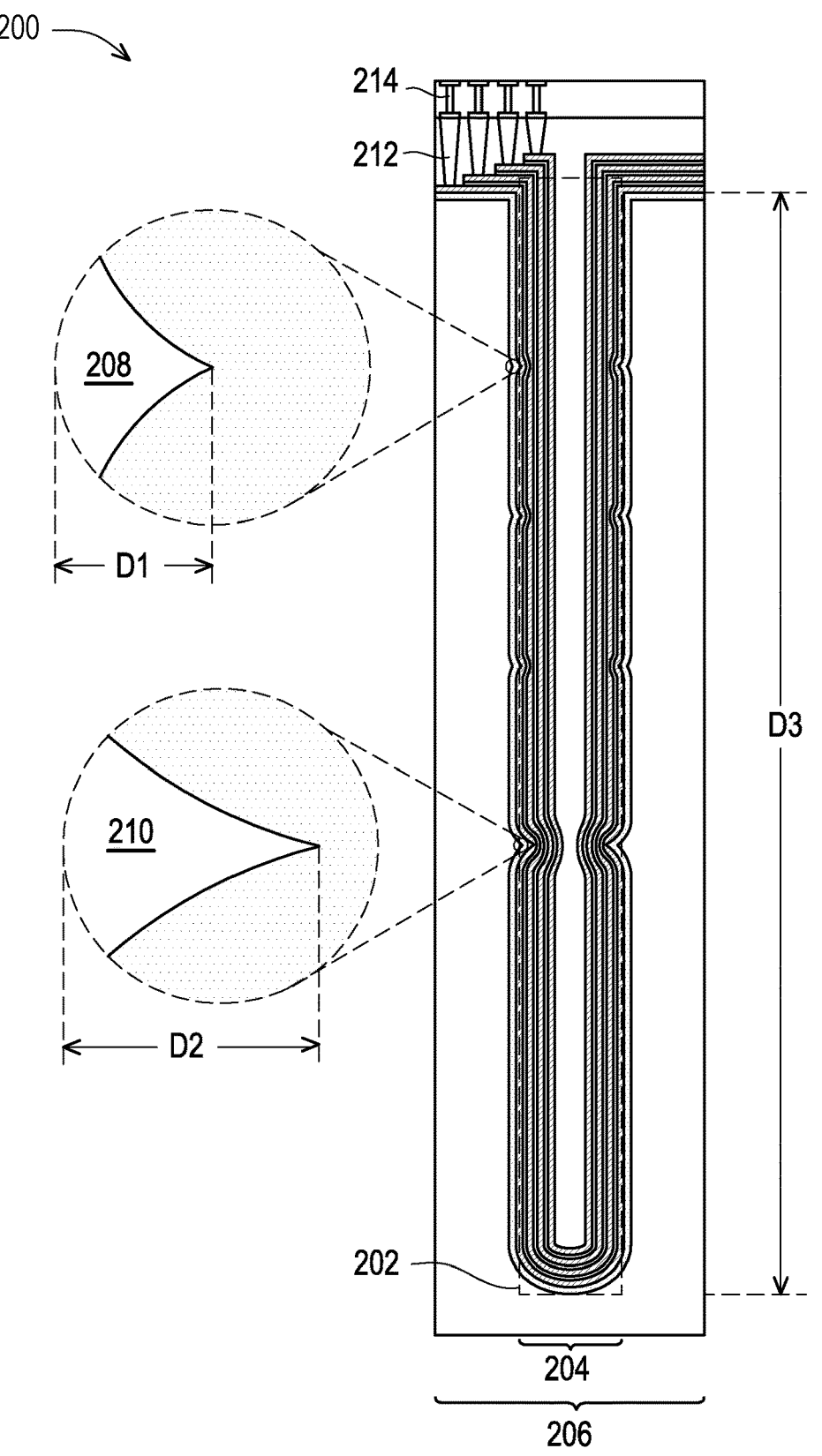
FIGS. 2A and 2B are diagrams of a device including an example trench capacitor structure described herein.
Figure 2B:
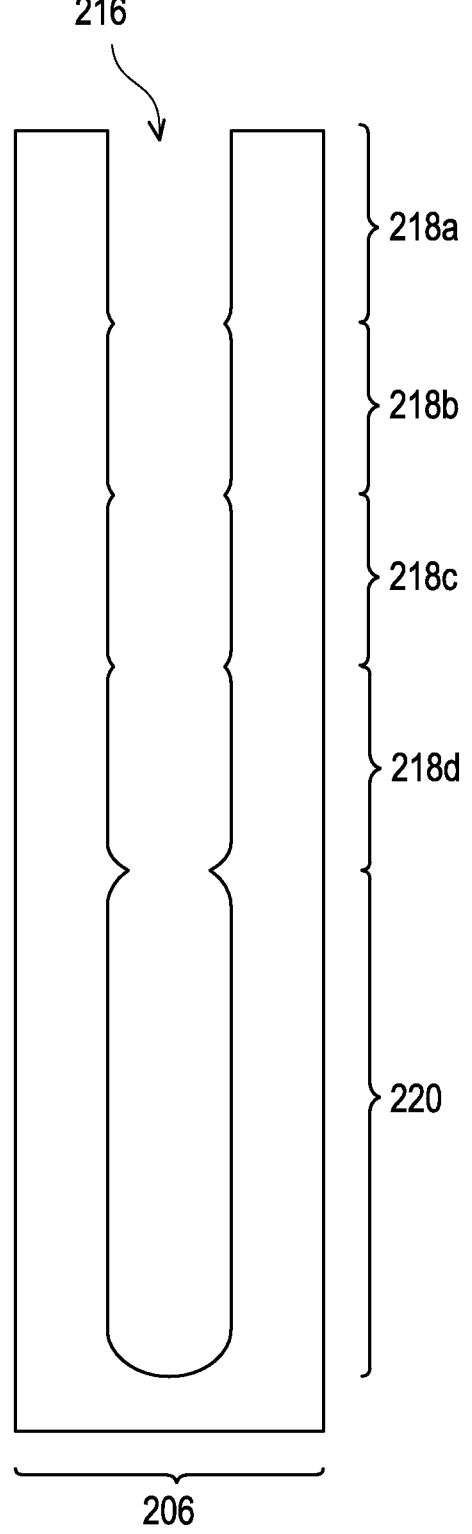

FIGS. 2A and 2B are diagrams of a device 200 including an example trench capacitor structure 202 described herein. The device 200 may correspond to a portion of a memory device or an imager device, among other examples. The example trench capacitor structure 202 may be formed using one or more of the semiconductor processing tools 102-116 described in connection with FIG. 1.

As shown in the side view of FIG. 2A, the trench capacitor structure 202 is included as part of a capacitor region 204 of the device 200. The device 200 includes a semiconductor substrate 206 in which the capacitor region 204 including the trench capacitor structure 202 is formed. The semiconductor substrate 206 further includes a transition structure 208 (e.g., at least one first rib structure) that includes a width D1 (e.g., a first width) and that extends into the capacitor region 204. The semiconductor substrate 206 includes a transition structure 210 (e.g., a second rib structure) that includes a width D2 (e.g., a second width) and that extends into a portion of the capacitor region 204 that is below the transition structure 208 (e.g., below the at least one first rib structure). In some implementations, the width D2 is greater relative to the width D1. In some implementations, and as shown in FIG. 2A, the trench capacitor structure 202 penetrates a depth D3 into the semiconductor substrate 206.

As described in greater detail in connection with FIGS. 2B-6 and elsewhere here in, the width D1, the width D2, and the depth D3 may have dimensional values that result from a series of processes performed by one or more of the semiconductor processing tools 102-116 that form a recess in the semiconductor substrate 206. The series of processes may include an in-situ oxidation/nitridation process by the etch tool 108 and an ex-situ deposition process by the deposition tool 102, among other examples.

As further shown in FIG. 2A, the device 200 includes one or more vertical interconnect access (via) structures 212 that connect to the trench capacitor structure 202. The device 200 further includes one or more traces 214 (e.g., redistribution layer (RDL) traces, among other examples), that may connect the trench capacitor structure 202 to integrated circuitry of the device 200 through the via structures 212 (e.g., memory integrated circuitry of a memory device or photodiode integrated circuitry of an imager device, among other examples).

FIG. 2B includes details of a trench capacitor recess 216 formed in the semiconductor substrate 206. As described in greater detail in connection with FIGS. 3A-6 and elsewhere herein, the trench capacitor recess 216 may be used as part of forming the trench capacitor structure 202 of FIG. 2. The trench capacitor recess 216 may include one or more upper segments 218a-218d formed using a cyclic process that includes an in-situ oxidation/nitridation process by an etch tool (e.g., the etch tool 108). The trench capacitor recess 216 may further include a lower segment 220 formed using a process that includes an ex-situ deposition process by a deposition tool (e.g., the deposition tool 102 of FIG. 1, among other examples).

As indicated above, FIGS. 2A and 2B are examples. Other examples may differ from what is described with regard to FIGS. 2A and 2B.

FIGS. 3A-3I are diagrams of an example manufacturing process 300 used to fabricate the device 200 including the trench capacitor structure 202 described herein. The example manufacturing process 300 may use one or more of the semiconductor processing tools 102-116 as described in connection with FIG. 1.

Figure 3A:
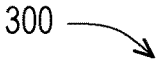
Figure 3A:
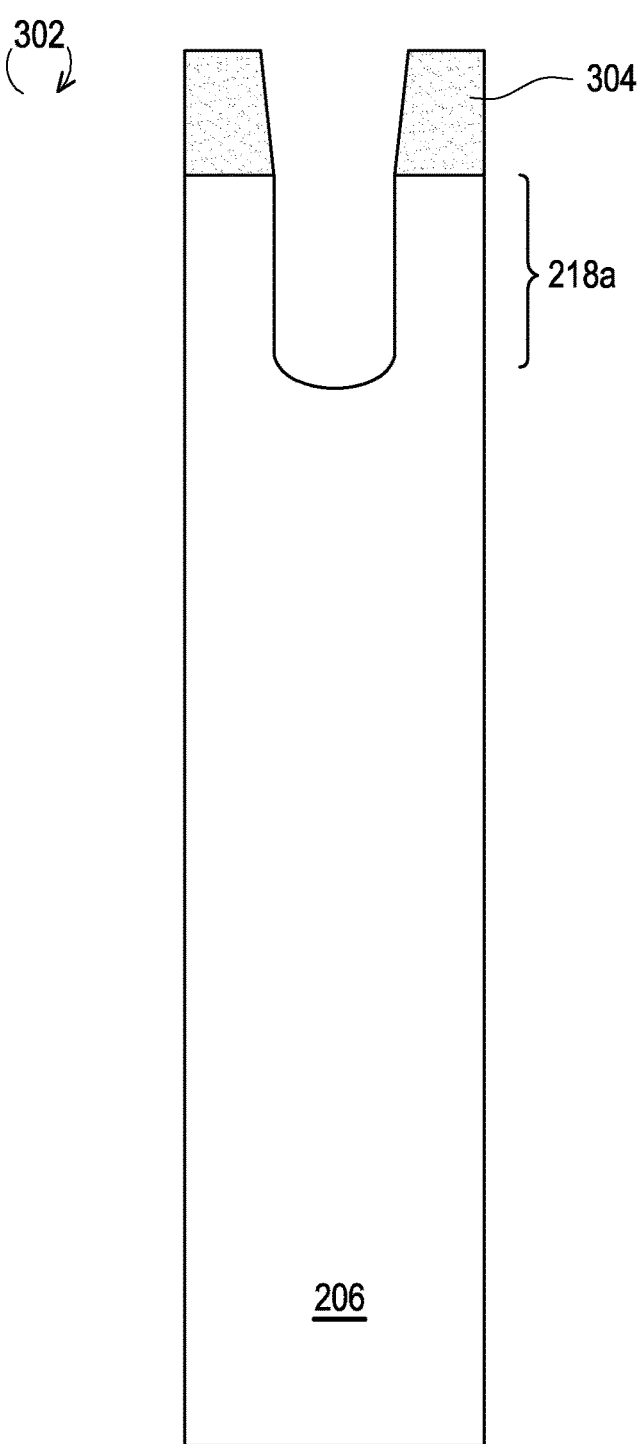

As shown in the side view of FIG. 3A, and as part of a series of one or more operations 302, a pattern in a hard mask layer 304 (e.g., a patterned layer of a silicon nitride (SiN) material, among other examples) is used to etch the semiconductor substrate 206 to form the upper segment 218a of a deep trench capacitor recess. The etch tool 108 etches the semiconductor substrate 206 based on the pattern to form the upper segment 218a in the semiconductor substrate 206. In some implementations, the etch operation includes a reactive ion etch (RIE) operation. In some implementations, the etch operation includes another type of etch operation, such as a dry etch operation, a plasma-based etch operation, a wet etch operation, and/or another suitable etch operation. In some implementations, a photoresist layer is used as an alternative technique for etching the semiconductor substrate 206 based on a pattern.

Figure 3B:
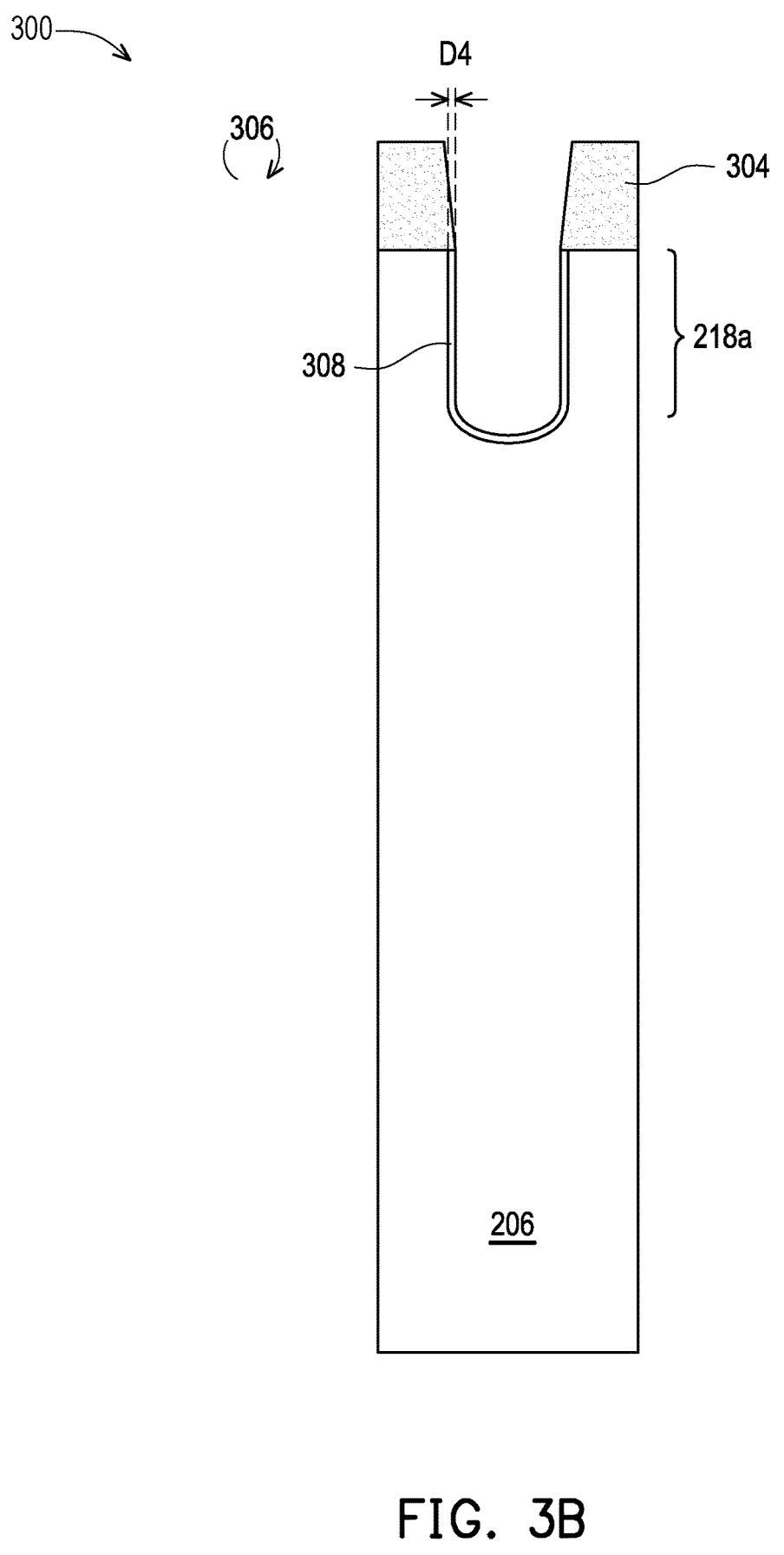

As shown in the side view of FIG. 3B, and as part of a series of one or more operations 306, a layer of protective material 308 is formed on sidewalls and on a bottom surface of the upper segment 218a. The layer of protective material 308 may be formed by the etch tool 108 as part of an in-situ oxidation/nitridation operation. The in-situ oxidation/nitridation operation is performed "in-situ," meaning that the in-situ oxidation/nitridation operation is performed in the same processing chamber of the etch tool 108 as the etch operation performed at 302 described in connection with FIG. 3A. Therefore, the etch operation performed at 302 may also be referred to as an in-situ etch operation. The etch tool 108 may grow the layer of protective material 308 by oxidation or nitridation as opposed to a dedicated deposition operation to deposit the layer of protective material 308, which would otherwise be performed by the deposition tool 102. In some implementations, the etch operation and the in-situ oxidation/nitridation operation are performed in the processing chamber of the etch tool 108 without breaking the vacuum in the processing chamber. In some implementations, in-situ oxidation/nitridation operation may be part of and/or may occur during a plasma-flush operation that is performed in the processing chamber of the etch tool 108 after the etch operation performed at 302. In some implementations, in-situ oxidation/nitridation operation includes a dedicated/standalone oxidation operation or nitridation operation, among other examples. In some implementations, the layer of protective material 308 includes a nitride material (e.g., silicon nitride ($Si_xN_y$) or another nitride material). In some implementations, the layer of protective material 308 includes an oxide material (e.g., silicon oxide ($SiO_x$) or another oxide material), among other examples.

A thickness D4 of the layer of protective material 308 may be included in a range of approximately 1 nanometer to approximately 7 nanometers. If the thickness D4 is less than approximately 1 nanometer, an amount of the layer of the protective material 308 may be insufficient to protect side-walls of the upper segment 218a during a subsequent etching operation. If the thickness D4 is greater than approximately 7 nanometers, the formation of the layer of protective material 308 may have taken an inordinate amount of processing time and/or be beyond an in-situ deposition process capability of the etch tool 108. However, other values and ranges for the thickness D4 are within the scope of the present disclosure.

Figure 3C:
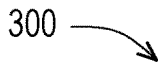
Figure 3C:
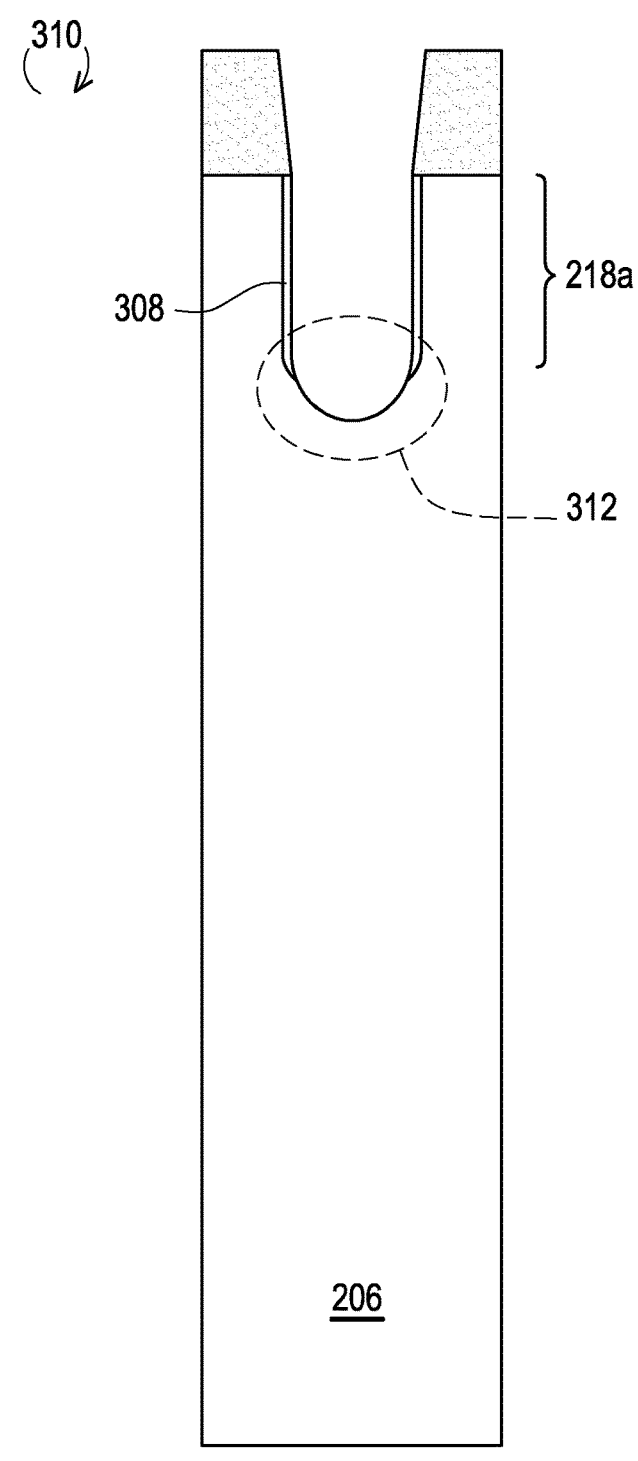

As shown in the side view of FIG. 3C, and as part of a series of one or more operations 310, a portion of the layer of protective material 308 is removed from a bottom surface 312 of the upper segment 218a. In some implementations, the portion of the layer of protective material 308 is removed (e.g., etched) by the etch tool 108 using an RIE operation. In some implementations, the etch operation includes another type of etch operation, such as a dry etch operation, a plasma-based etch operation, a wet etch operation, and/or another suitable etch operation. In some implementations, the etch operation at 310 is performed in-situ with the in-situ oxidation/nitridation at 306 and/or in-situ with the etch operation at 302. In some implementations, removing the portion of the layer of protective material 308 from the bottom surface 312 corresponds to a "break-through" etch operation that uses an RIE etch recipe tailored to remove the portion of the layer of protective material 308 on the bottom surface of the upper segment 218a.

Figure 3D:
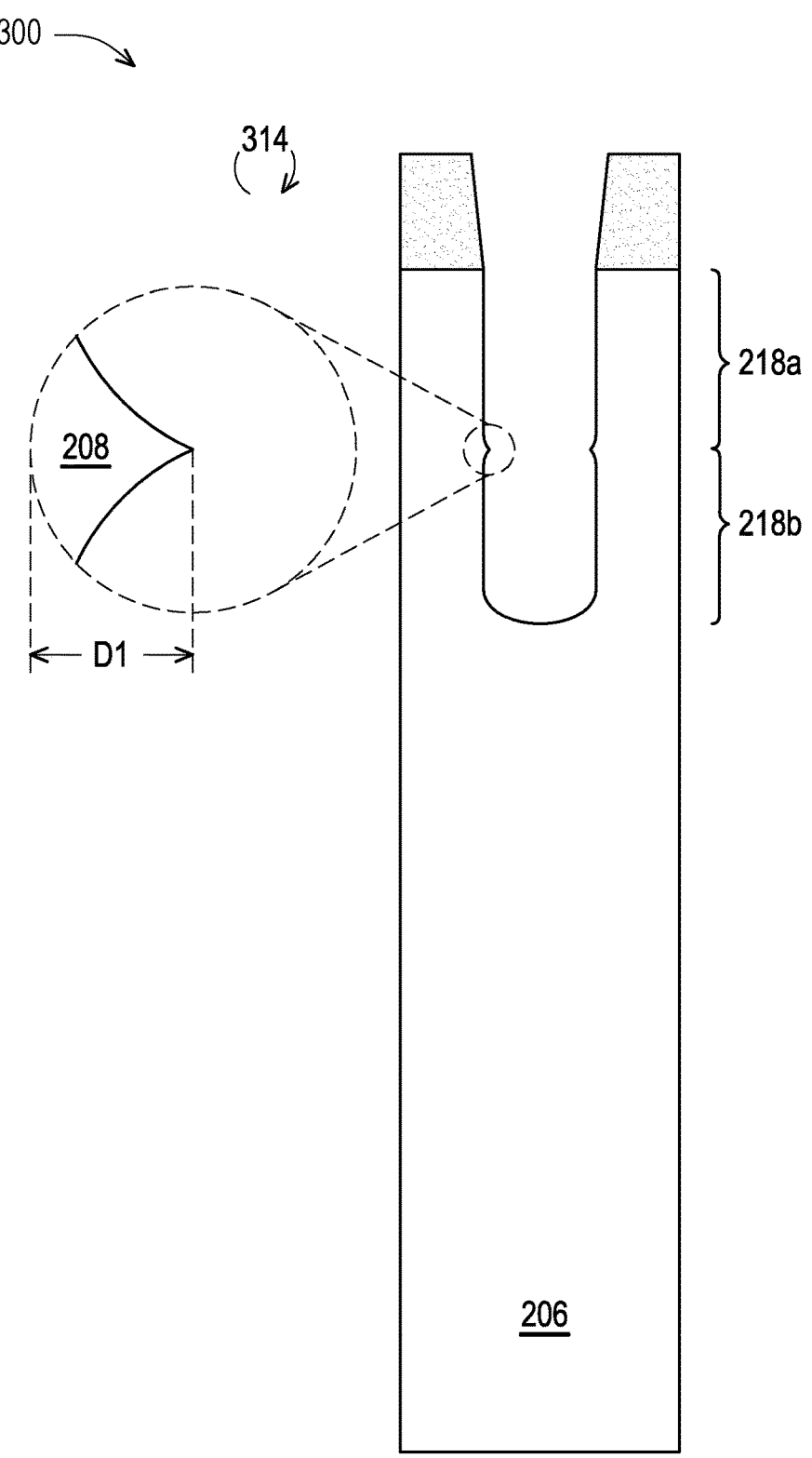

As shown in the side view of FIG. 3D, and as part of a series of one or more operations 314, a portion of the semiconductor substrate 206 (e.g., an amount of silicon) is removed to form an upper segment 218b of the deep trench capacitor recess below and/or under the upper segment 218a. For example, the portion of the semiconductor substrate 206 may be removed (e.g., etched) by the etch tool 108 using an RIE operation to form the upper segment 218b. In some implementations, the etch operation includes another type of etch operation, such as a dry etch operation, a plasma-based etch operation, a wet etch operation, and/or another suitable etch operation. In some implementations, the etch operation at 314 is performed in-situ with the etch operation at 310, in-situ with the in-situ oxidation/nitridation at 306 and/or in-situ with the etch operation at 302. In some implementations, removing the portion of the semiconductor substrate 206 may include an etch operation that uses an RIE etch recipe tailored to remove the portion of the semiconductor substrate 206 to form the upper segment 218b, as well as remaining portion of the layer of protective material 308 from the sidewalls of the upper segment 218a.

Additionally, or alternatively and as part of forming the upper segment 218b, the series of one or more operations 314 may result in formation of the transition structure 208 such that the transition structure 208 includes the width D1. In some implementations, the width D1 is included in a range of approximately 1 nanometer to approximately 7 nanometers. If the width D1 is less than approximately 1 nanometer, a thickness of the layer of protective material 308 as described in connection with FIG. 3B may have been insufficient to protect the upper segment 218a during etching as part of the series of one or more operations 314. Additionally, or alternatively, the upper segment 218a and/or the upper segment 218b may have been over-etched. If the width D1 is greater than approximately 7 nanometers, formation of the layer of protective material 308 as described in connection with FIG. 3B may have taken an inordinate amount of processing time and/or be beyond an in-situ oxidation process capability of the etch tool 108. Additionally, or alternatively, the upper segment 218a and/or the upper segment 218b may have been under-etched. However, other values and ranges for the width D1 are within the scope of the present disclosure.

Figure 3E:
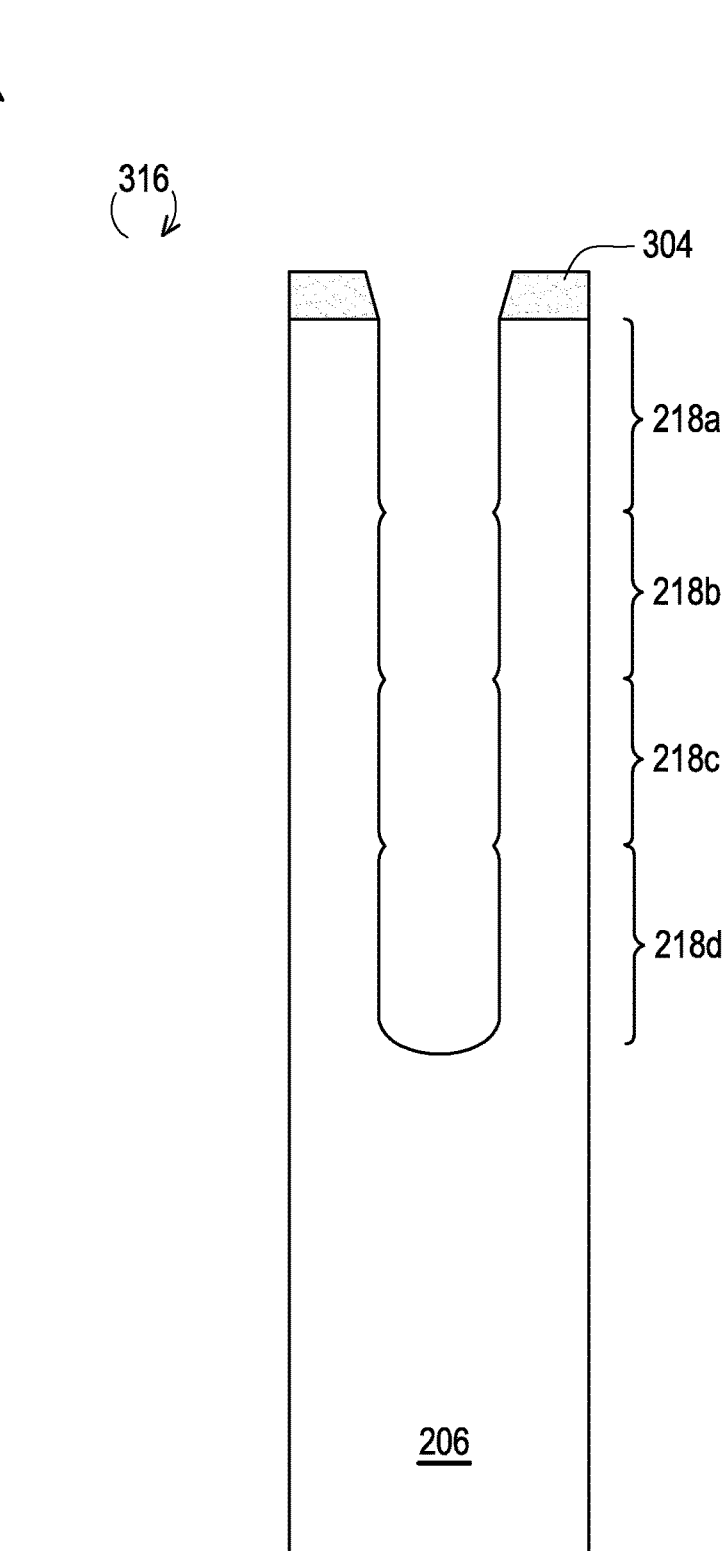

As shown in the side view of FIG. 3E, and as part of a series of one or more operations 316, upper segments 218c and 218d of the deep trench capacitor recess are formed below upper segment 218b. To form the upper segments 218c and 218d, the etch tool 108 may perform multiple cycles of in-situ oxidation operations and RIE etching operations similar to those described in FIGS. 3B-3D. In some implementations, and due to repeated etching cycles, a thickness of the hard mask layer 304 is reduced. In some implementations, the operations described in connection with FIGS. 3B-3D may be performed for a plurality of cycles until a particular depth for the deep trench capacitor recess is achieved. For example, the operations described in connection with FIGS. 3B-3D may be performed for a plurality of cycles until a depth of approximately 15 nanometers for the deep trench capacitor recess is achieved. However, other values for the depth are within the scope of the present disclosure. The depth at which the plurality of cycles are performed until may be based on the width of the deep trench capacitor recess and/or another parameter. In some implementations, the operations described in connection with FIGS. 3B-3D may be performed for a plurality of cycles until a particular aspect ratio for the deep trench capacitor recess (e.g., a ratio between a depth of the deep trench capacitor recess and a width of the deep trench capacitor recess) is achieved.

Figure 3F:
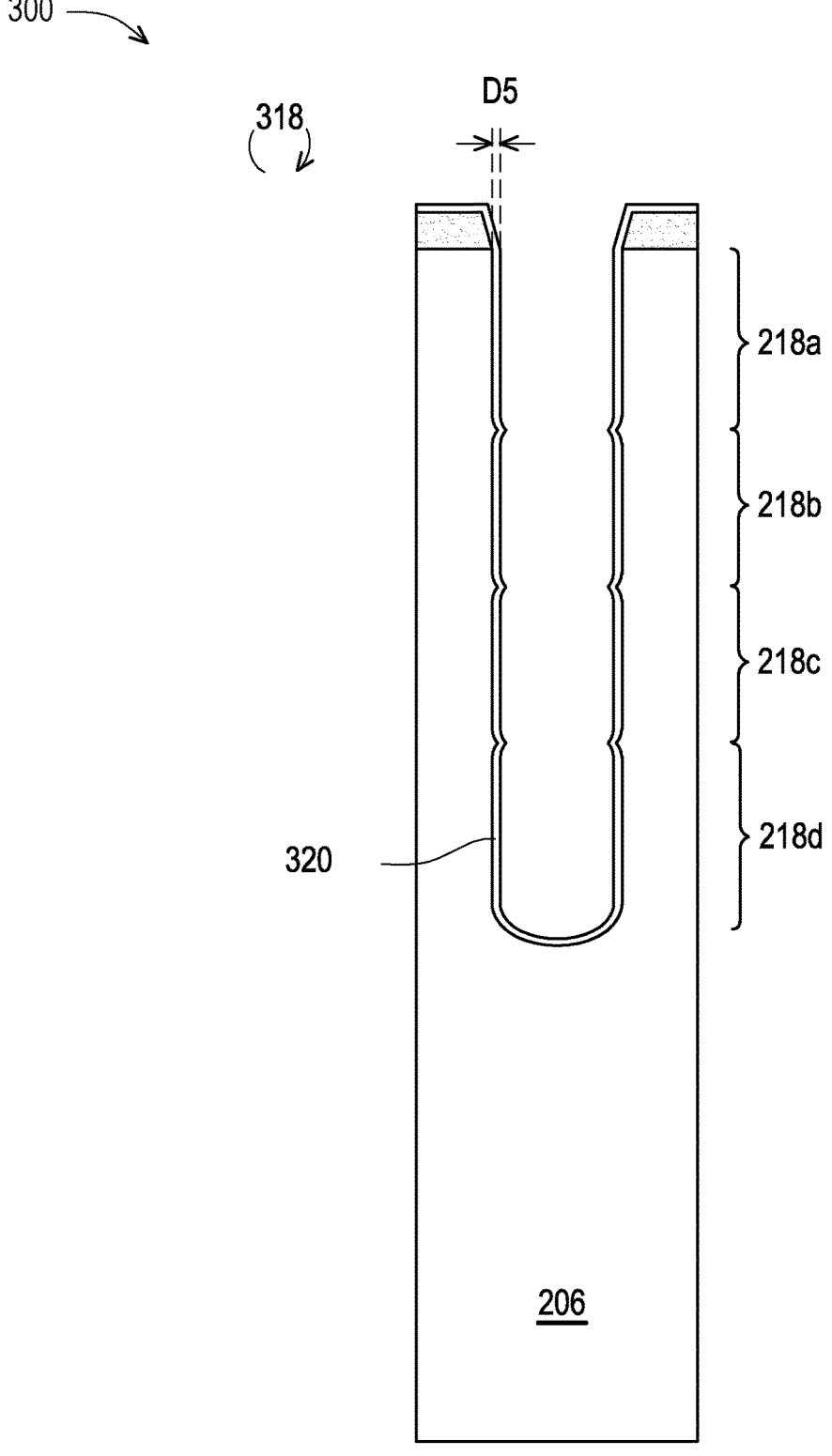

As shown in the side view of FIG. 3F, and as part of a series of one or more operations 318, a layer of a protective material 320 is formed on surfaces of the upper segments 218a-218d. For example, the deposition tool 102 of FIG. 1 may form the layer of protective material 320 using an ex-situ deposition process. The ex-situ deposition process may form the layer of protective material 320 on the surfaces of the upper segments 218a-218d to a thickness that is greater than a process capability of an in-situ deposition process. The increased thickness may provide additional protection to the upper segments 218a-218d during extended etching of a lower segment (e.g., the lower segment 220). Such an ex-situ deposition process may include an ALD process, a PVD process, or another CVD process, among other examples. The ex-situ deposition process may be "ex-situ" in that the ex-situ deposition process is performed after the semiconductor substrate 206 is transferred to a different processing chamber than the processing chamber in which the operations described in connection with FIGS. 3B-3D are performed. In this way, the ex-situ deposition process is performed in a different processing chamber than the processing chamber in which the operations described in connection with FIGS. 3B-3D are performed. In some implementations, the layer of protective material 320 includes a nitride material (e.g., silicon nitride ($Si_xN_y$) or another nitride material). In some implementations, the layer of protective material 320 includes an oxide material (e.g., silicon oxide ($SiO_x$) or another oxide material), among other examples. The process for forming the deep trench capacitor recess may switch to the use of a deposited protective film, as opposed to a protective film that is grown by oxidation or nitridation, once the particular depth and/or the particular aspect ratio for the deep trench capacitor recess is achieved.

In some implementations, a thickness D5 of the layer of protective material 320 may be included in a range of approximately 5 nanometers to approximately 100 nanometers. If the thickness D5 is less than approximately 5 nanometers, the deposition tool 102 may have deposited an insufficient amount of the layer of protective material 320 to protect sidewalls of the upper segments 218a-218d and maintain a desired aspect ratio of a trench capacitor recess (e.g., the trench capacitor recess 216) during a subsequent etching operation. If the thickness D5 is greater than approximately 100 nanometers, the ex-situ deposition process may have taken an inordinate amount of time. However, other values and ranges for the thickness D5 are within the scope of the present disclosure.

Figure 3G:
Figure 3G:
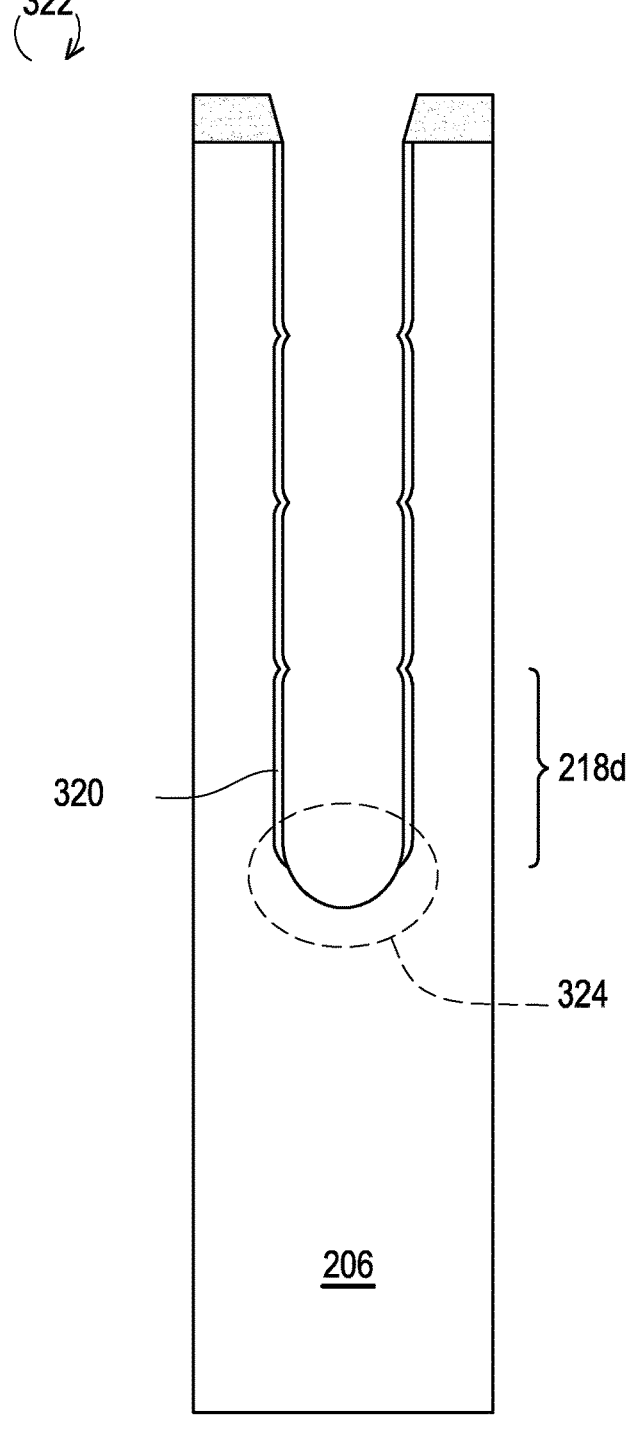

As shown in the side view of FIG. 3G, and as part of a series of one or more operations 322, a portion of the layer of protective material 320 is removed from a bottom surface 324 of the upper segment 218d. In some implementations, the portion of the layer of protective material 320 is removed (e.g., etched) by the etch tool 108 using an RIE operation or another type of etch operation. In some implementations, removing the portion of the layer of protective material 308 from the bottom surface 324 corresponds to a "break-through" etch operation that uses an RIE etch recipe tailored to remove the portion of the layer of protective material 320 on the bottom surface of the upper segment 218a.

Figure 3H:
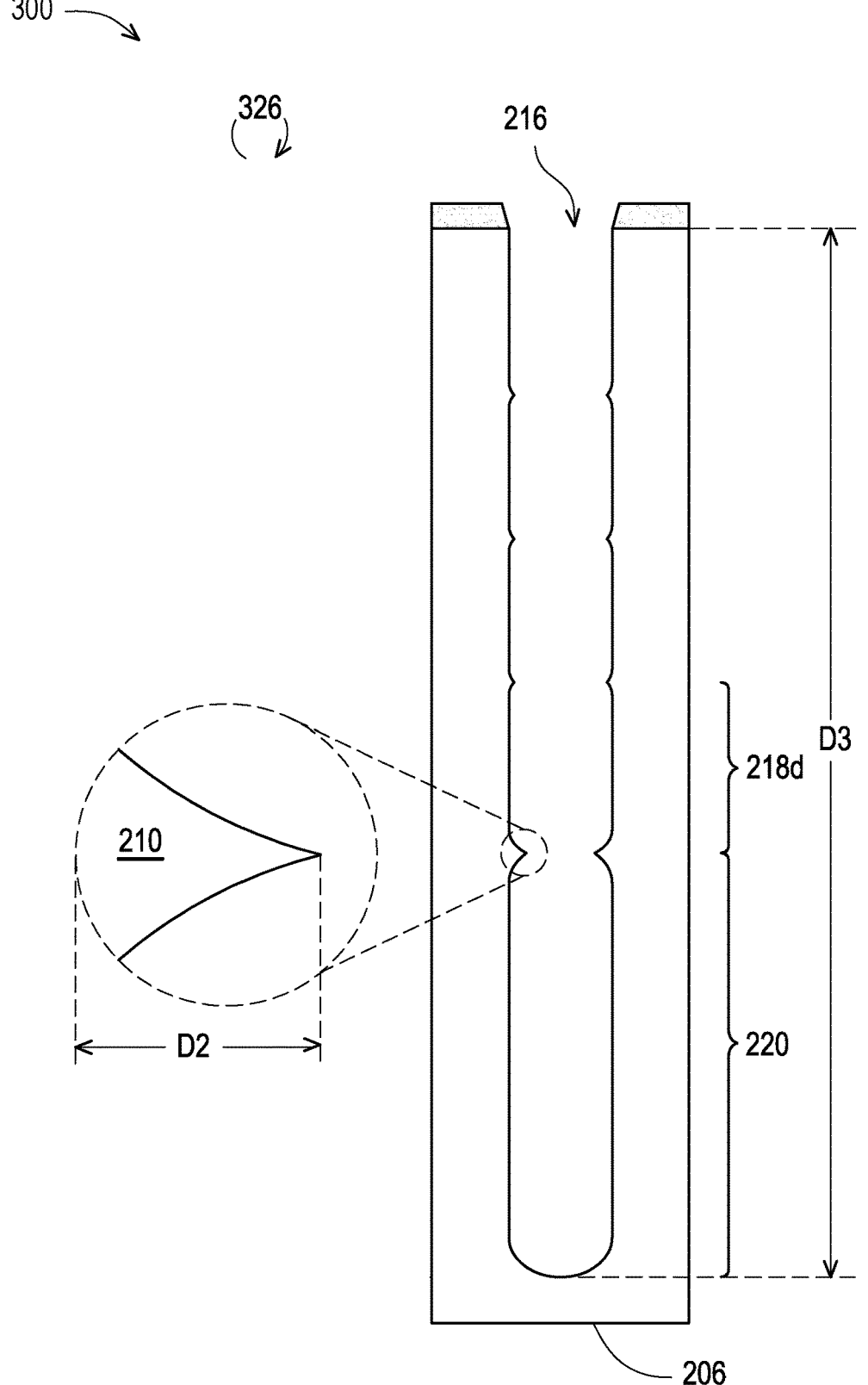

As shown in the side view of FIG. 3H, and as part of a series of one or more operations 326, a portion of the semiconductor substrate 206 is removed to form the lower segment 220 below the upper segment 218d. For example, the portion of the semiconductor substrate 206 may be removed (e.g., etched) by the etch tool 108 using an RIE operation or another type of etch operation to form the lower segment 220. In some implementations, removing the portion of the semiconductor substrate 206 may include an etch operation that uses an RIE etch recipe tailored to remove the portion of the semiconductor substrate 206 to form the lower segment 220, as well as remaining portions of the layer of protective material 320 from the sidewalls of the upper segments 218a-218d.

Additionally, or alternatively and as part of forming the lower segment 220, the series of one or more operations 326 may form the transition structure 210 to include the width D2. In some implementations, the width D2 is included in a range of approximately 5 nanometers to approximately 100 nanometers. If the width D2 is less than approximately 5 nanometers, a thickness of the layer of protective material 320 as described in connection with FIG. 3F may have been insufficient to protect the upper segments 218a-218d during etching as part of the series of one or more operations 326. Additionally, or alternatively, the upper segment 218d and/or the lower segment 220 may have been over-etched. If the width D2 is greater than approximately 100 nanometers, formation of the layer of protective material 320 as described in connection with FIG. 3F may have taken an inordinate amount of processing time and/or be beyond a deposition process capability of the deposition tool 102. Additionally, or alternatively, the upper segment 218d and/or the lower segment 220 may have been under-etched. However, other values and ranges for the width D2 are within the scope of the present disclosure.

In some implementations, a depth D3 of the trench capacitor recess 216 (e.g., corresponding to a depth of the trench capacitor structure 202 of FIG. 1) may be included in a range of approximately is included in a range of approximately 15.3 microns to approximately 18.7 microns. If the depth D3 is less than approximately 15.3 microns, a capacitance of a trench capacitor structure subsequently formed in the recess (e.g., the trench capacitor structure 202) may be less than a targeted value. If the depth D3 is greater than approximately 18.7 microns, an increase in etching time as part of the one or more operations 326 may be realized.

However, other values and ranges for the depth D3 are within the scope of the present disclosure.

Figure 3I:
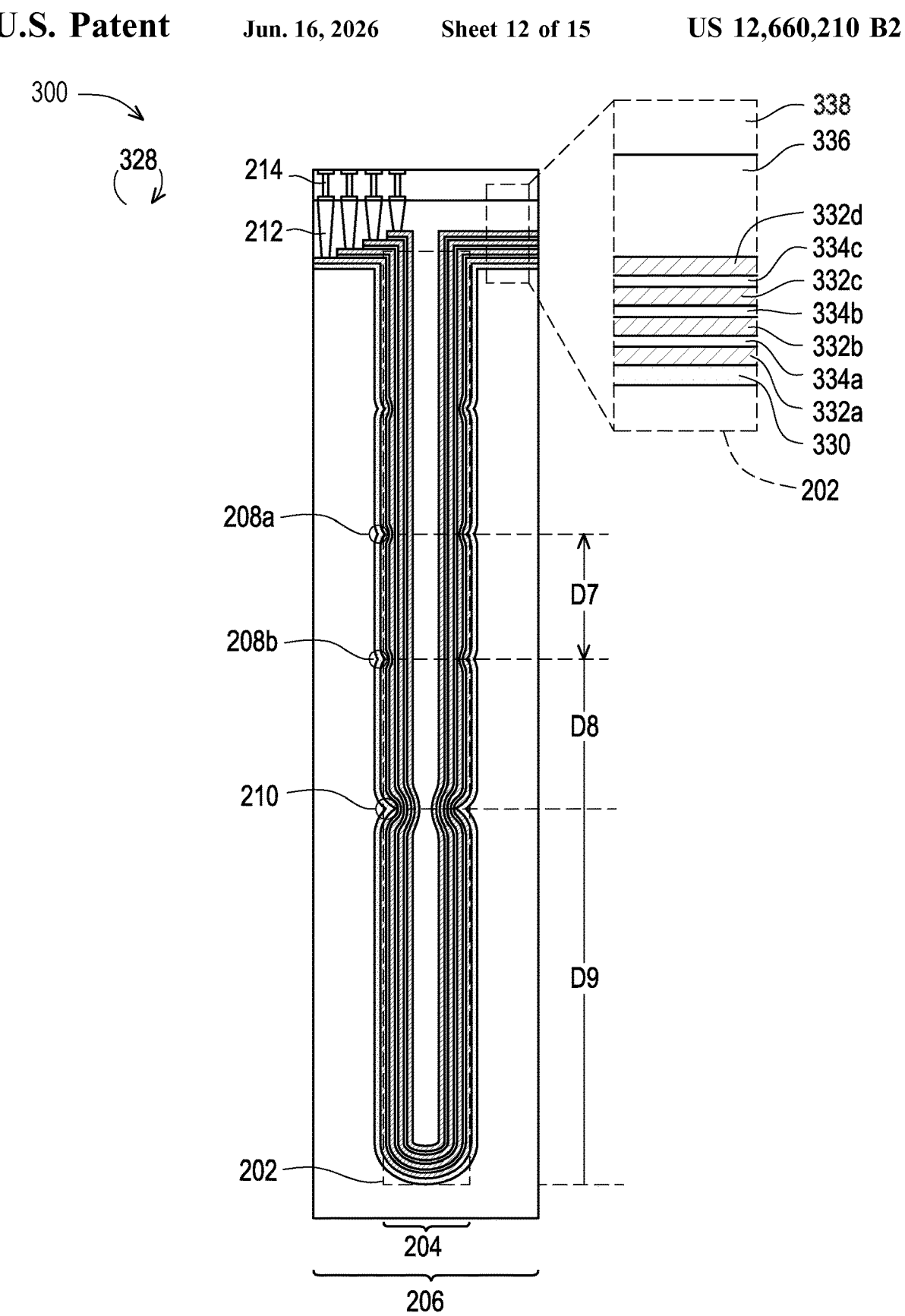

As shown in the side view of FIG. 3I, and as part of a series of one or more operations 328, the trench capacitor structure 202 is formed in the capacitor region 204 of the semiconductor substrate 206 (e.g., formed in the trench capacitor recess 216). The series of operations 328 may include the deposition tool 102 forming a spacer layer 330 (e.g., a layer of a silicon dioxide (SiO₂) material or a silicon oxynitride (SiON) material, among other examples) on the transition structures 208 and 210. The deposition tool 102 may further form one or more electrode layers 332a-332d (e.g., layers of a conductive material such a tantalum (Ta) material, a tantalum nitride (TaN) material, or a titanium nitride (TiN, among other examples) that are interspersed with one or more insulator layers 334a-334c (e.g., layers of a dielectric material such as an aluminum oxide (Al₂O₃) material, among other examples). Furthermore, the deposition tool 102 may form one or more isolation layers 336 and 338 (e.g., layers of a dielectric material such as a silicon oxide (SiO₂) material, among other examples) to isolate structures within the device 200. The deposition tool 102 may deposit the spacer layer 330, the one or more electrode layers 332a-332d, the one or more insulator layers 334a-334c, and the isolation layers 336 and 338 using a PVD operation, an ALD operation, a CVD operation, an epitaxy operation, another type of deposition operation described in connection with FIG. 1, and/or another suitable deposition operation.

The series of operations 328 may further one or more lithography operations by the exposure tool 104 and/or the develop tool 106 to expose patterns used to form the via structures 212 and/or the traces 214.

The series of operations 328 may include one or more etch operations to etch recesses used to form of the via structure 212 and/or the traces 214. The one or more etch operations may include a plasma etch operation, a wet chemical etch operation, another type of etch operation described in connection with FIG. 1, and/or another suitable etch operation.

In some implementations, an aspect ratio (e.g., a ratio of a width to a height) of the trench capacitor structure 202 may be included in a range of approximately in a range of approximately 45:1 to approximately 55:1. If the aspect ratio is less than approximately 45:1, a capacitance of the trench capacitor structure 202 may be incompatible with design parameters and/or integrated circuitry of the device 200. If the aspect ratio is greater than approximately 55:1, an increase in etching time by the etch tool 108 may be realized. However, other values and ranges for the aspect ratio are within the scope of the present disclosure.

In some implementations, segment lengths associated with the trench capacitor structure 202 may vary. For example, a length D7 of a segment of the trench capacitor structure 202 between like transition structures (e.g., a distance between the transition structures 208a and 208b) may be greater relative to a length D8 of a segment of the trench capacitor structure 202 between unlike transition structures (e.g., a distance between the transition structure 208b and the transition structure 210). Additionally, or alternatively, the length D7 of the segment of the trench capacitor structure 202 may be lesser relative to a length D9 of a segment between the transition structure 210 and a bottom of the trench capacitor structure 202.

The number and arrangement of operations shown in FIGS. 3A-3I are provided as one or more examples. In practice, there may be additional operations, fewer operations, different operations, or differently arranged operations than those shown in FIGS. 3A-3I. Furthermore, two or more operations shown in FIGS. 3A-3I may be performed by a single semiconductor processing tool, or a single operation shown in FIGS. 3A-3I may be distributed across multiple semiconductor processing tools.

Figure 4:
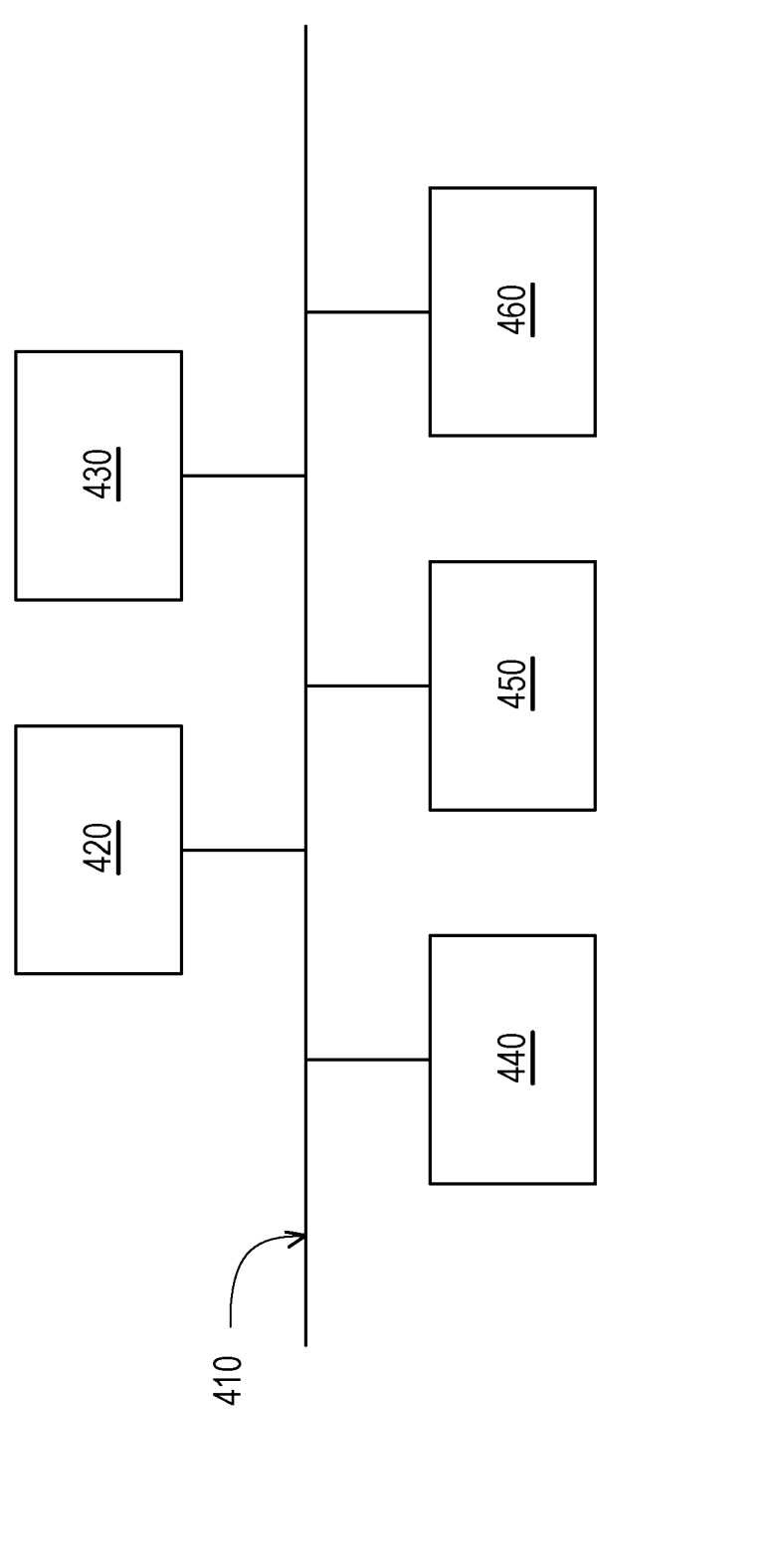
FIG. 4 is a diagram of example components of one or more devices of FIG. 1 described herein.

FIG. 4 is a diagram of example components of a device 400 associated with semiconductor device and methods of manufacturing. Device 400 may correspond to one or more of the semiconductor processing tools 102-116. In some implementations, one or more of the semiconductor processing tools 102-116 may include one or more devices 400 and/or one or more components of device 400. As shown in FIG. 4, device 400 may include a bus 410, a processor 420, a memory 430, an input component 440, an output component 450, and a communication component 460.

Bus 410 may include one or more components that enable wired and/or wireless communication among the components of device 400. Bus 410 may couple together two or more components of FIG. 4, such as via operative coupling, communicative coupling, electronic coupling, and/or electric coupling. Processor 420 may include a central processing unit, a graphics processing unit, a microprocessor, a controller, a microcontroller, a digital signal processor, a field-programmable gate array, an application-specific integrated circuit, and/or another type of processing component. Processor 420 is implemented in hardware, firmware, or a combination of hardware and software. In some implementations, processor 420 may include one or more processors capable of being programmed to perform one or more operations or processes described elsewhere herein.

Memory 430 may include volatile and/or nonvolatile memory. For example, memory 430 may include random access memory (RAM), read only memory (ROM), a hard disk drive, and/or another type of memory (e.g., a flash memory, a magnetic memory, and/or an optical memory). Memory 430 may include internal memory (e.g., RAM, ROM, or a hard disk drive) and/or removable memory (e.g., removable via a universal serial bus connection). Memory 430 may be a non-transitory computer-readable medium. Memory 430 stores information, instructions, and/or software (e.g., one or more software applications) related to the operation of device 400. In some implementations, memory 430 may include one or more memories that are coupled to one or more processors (e.g., processor 420), such as via bus 410.

Input component 440 enables device 400 to receive input, such as user input and/or sensed input. For example, input component 440 may include a touch screen, a keyboard, a keypad, a mouse, a button, a microphone, a switch, a sensor, a global positioning system sensor, an accelerometer, a gyroscope, and/or an actuator. Output component 450 enables device 400 to provide output, such as via a display, a speaker, and/or a light-emitting diode. Communication component 460 enables device 400 to communicate with other devices via a wired connection and/or a wireless connection. For example, communication component 460 may include a receiver, a transmitter, a transceiver, a modem, a network interface card, and/or an antenna.

Device 400 may perform one or more operations or processes described herein. For example, a non-transitory computer-readable medium (e.g., memory 430) may store a set of instructions (e.g., one or more instructions or code) for execution by processor 420. Processor 420 may execute the set of instructions to perform one or more operations or processes described herein. In some implementations, execution of the set of instructions, by one or more processors 420, causes the one or more processors 420 and/or the device 400 to perform one or more operations or processes described herein. In some implementations, hardwired circuitry is used instead of or in combination with the instructions to perform one or more operations or processes described herein. Additionally, or alternatively, processor 420 may be configured to perform one or more operations or processes described herein. Thus, implementations described herein are not limited to any specific combination of hardware circuitry and software.

The number and arrangement of components shown in FIG. 4 are provided as an example. Device 400 may include additional components, fewer components, different components, or differently arranged components than those shown in FIG. 4. Additionally, or alternatively, a set of components (e.g., one or more components) of device 400 may perform one or more functions described as being performed by another set of components of device 400.

FIG. 5 is a flowchart of an example process 500 associated with forming the trench capacitor structure 202 described herein. In some implementations, one or more process blocks of FIG. 5 are performed by one or more of the semiconductor processing tools 102-116. Additionally, or alternatively, one or more process blocks of FIG. 5 may be performed by one or more components of device 400, such as processor 420, memory 430, input component 440, output component 450, and/or communication component 460.

As shown in FIG. 5, process 500 may include forming a vertically arranged sequence of two or more upper segments of a trench capacitor recess using two or more cycles of a combination of operations including an in-situ oxidation or nitridation operation that includes forming a first protective material on sidewalls and a temporary bottom surface of at least a first upper segment of the two or more upper segments (block 510). For example, the etch tool 108 may form a vertically arranged sequence of two or more upper segments 218a-218d of a trench capacitor recess 216 using two or more cycles of a combination of operations including an in-situ oxidation or nitridation operation that includes forming a first protective material (e.g., the layer of protective material 308) on sidewalls and a temporary bottom surface of at least a first upper segment of the two or more upper segments, as described above.

As further shown in FIG. 5, process 500 may include forming a second protective material on sidewalls of the two or more upper segments using an ex-situ deposition operation (block 520). For example, one or more of the semiconductor processing tools 102-116 (e.g., the deposition tool 102, among other examples) may form a second protective material (e.g., the layer of protective material 320) on sidewalls of the two or more upper segments (e.g., the upper segments 218a-218d) using an ex-situ deposition operation, as described above.

As further shown in FIG. 5, process 500 may include forming a lower segment of the trench capacitor recess below the vertically arranged sequence of two or more upper segments (block 530). For example, one or more of the semiconductor processing tools 102-116 (e.g., the etch tool 108, among other examples) may form a lower segment 220 of the trench capacitor recess 216 below the vertically arranged sequence of two or more upper segments, as described above.

As further shown in FIG. 5, process 500 may include forming one or more interspersed layers of a trench capacitor structure within the trench capacitor recess (block 540). For example, one or more of the semiconductor processing tools 102-116 (e.g., the deposition tool 102, among other examples) may form one or more interspersed layers (e.g., the electrode layers 332a-332d interspersed with the insulator layers 334a-334c, among other examples) of a trench capacitor structure 202 within the trench capacitor recess 216, as described above.

Process 500 may include additional implementations, such as any single implementation or any combination of implementations described below and/or in connection with one or more other processes described elsewhere herein.

In a first implementation, the in-situ oxidation or nitridation operation that forms the first protective material (e.g., the layer of protective material 308) on the sidewalls of at least the first upper segment of the two or more upper segments corresponds to a plasma-flush operation that grows a layer of oxide on the sidewalls.

In a second implementation, alone or in combination with the first implementation, the plasma-flush operation is performed in a same processing chamber as an in-situ etch operation to form the first upper segment.

In a third implementation, alone or in combination with one or more of the first and second implementations, forming the second protective material (e.g., the layer of protective material 320) on the sidewalls of the two or more upper segments using the ex-situ deposition operation includes forming the second protective material on the sidewalls of the two or more upper segments using an atomic layer deposition operation.

In a fourth implementation, alone or in combination with one or more of the first through third implementations, forming the second protective material (e.g., the layer of protective material 320) on the sidewalls of the two or more upper segments using the ex-situ deposition operation includes forming the second protective material to a thickness D5 that is included in a range of approximately 5 nanometers to approximately 100 nanometers.

In a fifth implementation, alone or in combination with one or more of the first through fourth implementations, forming the second protective material (e.g., the layer of protective material 320) on the sidewalls of the two or more upper segments using the ex-situ deposition operation includes forming the second protective material on the sidewalls of the two or more upper segments using a chemical vapor deposition operation.

In a sixth implementation, alone or in combination with one or more of the first through fifth implementations, forming the second protective material (e.g., the layer of protective material 320) on the sidewalls of the two or more upper segments using the ex-situ deposition operation includes forming a layer of a silicon nitride material or forming a layer of a silicon dioxide material.

In a seventh implementation, alone or in combination with one or more of the first through sixth implementations, the combination of operations further comprises performing a first etch operation to etch through the first protective material (e.g., the layer of protective material 308) on the temporary bottom surface, and performing a second etch operation to remove silicon (e.g., a portion of the semiconductor substrate 206) below at least the first upper segment.

In an eighth implementation, alone or in combination with one or more of the first through seventh implementations, the first etch operation and/or the second etch operation corresponds to a reactive ion etch operation.

Although FIG. 5 shows example blocks of process 500, in some implementations, process 500 includes additional blocks, fewer blocks, different blocks, or differently arranged blocks than those depicted in FIG. 5. Additionally, or alternatively, two or more of the blocks of process 500 may be performed in parallel.

FIG. 6 is a flowchart of an example process 600 associated with forming the trench capacitor structure 202 described herein. In some implementations, one or more process blocks of FIG. 6 are performed by the etch tool 108. Additionally, or alternatively, one or more process blocks of FIG. 6 may be performed by one or more components of device 400, such as processor 420, memory 430, input component 440, output component 450, and/or communication component 460.

As shown in FIG. 6, process 600 may include receiving a first delivery of a semiconductor substrate (block 610). For example, the etch tool 108 may receive a first delivery of a semiconductor substrate 206, as described above.

As further shown in FIG. 6, process 600 may include removing a first amount of a substrate material as part of forming a first upper segment of a trench capacitor recess that penetrates vertically into the semiconductor substrate (block 620). For example, the etch tool 108 may remove a first amount of a substrate material as part of forming a first upper segment (e.g., the upper segment 218c) of a trench capacitor recess 216 that penetrates vertically into the semiconductor substrate 206, as described above.

As further shown in FIG. 6, process 600 may include removing a second amount of the substrate material as part of forming a second upper segment of the trench capacitor recess below the first upper segment using a first layer of a first protective material that is formed on first sidewalls of the first upper segment in an in-situ operation (block 630). For example, the etch tool 108 may remove a second amount of the substrate material as part of forming a second upper segment (e.g., the upper segment 218d) of the trench capacitor recess 216 below the first upper segment using a first layer of a first protective material (e.g., the layer of protective material 308) that is formed on first sidewalls of the first upper segment in an in-situ operation, as described above.

As further shown in FIG. 6, process 600 may include receiving a second delivery of the semiconductor substrate after a second layer of a second protective material is formed on the first sidewalls of the first upper segment and on second sidewalls of the second upper segment in an ex-situ operation (block 640). For example, the etch tool 108 may receive a second delivery of the semiconductor substrate 206 after a second layer of a second protective material (e.g., the layer of protective material 320) is formed on the first sidewalls of the first upper segment and on second sidewalls of the second upper segment in an ex-situ operation, as described above.

As further shown in FIG. 6, process 600 may include removing a third amount of the substrate material as part of forming a lower segment the trench capacitor recess below the second upper segment using the second layer of the second protective material (block 650). For example, the etch tool 108 may remove a third amount of the substrate material as part of forming a lower segment 220 of the trench capacitor recess 216 below the second upper segment using the second layer of the second protective material, as described above.

Process 600 may include additional implementations, such as any single implementation or any combination of implementations described below and/or in connection with one or more other processes described elsewhere herein.

In a first implementation, a thickness of the first layer of the first protective material is included in a range of approximately 1 nanometer to approximately 7 nanometers.

In a second implementation, alone or in combination with the first implementation, removing the second amount of the substrate material as part of forming the second upper segment (e.g., the upper segment 218d) of the trench capacitor recess 216 that penetrates vertically into the semiconductor substrate 206 includes performing a first etch operation to etch through a bottom portion of the first layer of the first protective material (e.g., the layer of protective material 308) such that the first layer of the first protective material remains on the first sidewalls of the first upper segment, and performing a second etch operation after the first etch operation to remove the second amount of the substrate material as part of forming the second upper segment, where the first layer of the first protective material remaining on the first sidewalls of the first upper segment protects the first upper segment from being etched in the second etch operation, and where a combination of the first etch operation and the second etch operation results in formation of a transition structure 208 between the first upper segment and the second upper segment that extends horizontally towards the trench capacitor recess 216 a distance D1.

In a third implementation, alone or in combination with one or more of the first and second implementations, the transition structure 208 corresponds to a first transition structure and removing the third amount of the substrate material as part of forming the lower segment 220 of the trench capacitor recess 216 that penetrates vertically into the semiconductor substrate 206 includes performing a third etch operation to etch through a bottom portion of the second layer of the second protective material (e.g., the layer of protective material 320) such that the second layer of the second protective material remains on the first sidewalls of the first upper segment (e.g., the upper segment 218c) and second sidewalls of the second upper segment (e.g., the upper segment 218d) and performing a fourth etch operation after the third etch operation to remove the third amount of material as part of forming the lower segment 220, where the second layer of the second protective material remaining on the first sidewalls of the first upper segment and the second sidewalls of the second upper segment protects the first upper segment and the second upper segment from being etched in the second etch operation, and where a combination of the third etch operation and the fourth etch operation results in formation of a second transition structure (e.g., the transition structure 210) between the second upper segment and the lower segment that extends horizontally towards the trench capacitor recess 216 a distance D2.

In a fourth implementation, alone or in combination with one or more of the first through third implementations, process 600 includes forming a spacer layer 330 of a trench capacitor structure 202 in the trench capacitor recess 216, where forming the spacer layer 330 includes forming the spacer layer 330 on the first transition structure (e.g., the transition structure 208) and on the second transition structure (e.g., the transition structure 210).

In a fifth implementation, alone or in combination with one or more of the first through fourth implementations, process 600 includes forming an electrode layer 332a of the trench capacitor structure 202 in the trench capacitor recess 216, where forming the electrode layer 332a includes forming the electrode layer 332a on the spacer layer 330, over the first transition structure (e.g., the transition structure 208), and over the second transition structure (e.g., the transition structure 210).

Although FIG. 6 shows example blocks of process 600, in some implementations, process 600 includes additional blocks, fewer blocks, different blocks, or differently arranged blocks than those depicted in FIG. 6. Additionally, or alternatively, two or more of the blocks of process 600 may be performed in parallel.

Some implementations described herein include a deep trench capacitor structure and methods of formation. The deep trench capacitor structure may penetrate vertically into a silicon substrate. In some implementations, formation of the deep trench capacitor structure includes forming segments of a deep trench capacitor recess using a combination of in-situ deposition, ex-situ deposition, and reactive ion etching (RIE) techniques. By forming the deep trench capacitor recess using the in-situ deposition operation, ex-situ deposition, and RIE techniques, a deep trench capacitor structure may be formed that meets target critical dimensions and has an aspect ratio of approximately 50:1.

In this way, an electrical performance of an IC device may be improved relative to another IC device including another deep trench capacitor structure formed using another technique that excludes the ex-situ deposition operation. Additionally, and due to a reduction in etch times, resources used to form the deep trench capacitor structure may be reduced relative to resources used not using the ex-situ deposition operation and improve an overall efficiency of fabricating the deep trench capacitor structure.

As described in greater detail above, some implementations described herein provide a device. The device includes a capacitor region including a capacitor structure. The device includes a semiconductor substrate containing the capacitor structure. The semiconductor substrate includes at least one first rib structure that include a first width and that extends into the capacitor region. The semiconductor substrate includes a second rib structure that includes a second width and that extends into a portion of the capacitor region that is below the at least one first rib structure, where the second width is greater relative to the first width.

As described in greater detail above, some implementations described herein provide a method. The method includes forming a vertically arranged sequence of two or more upper segments of a trench capacitor recess using two or more cycles of a combination of operations. The combination of operations includes an in-situ deposition operation that includes depositing a first protective material on sidewalls and a temporary bottom surface of at least a first upper segment of the two or more upper segments. The method includes forming a second protective material on sidewalls of the two or more upper segments using an ex-situ deposition operation. The method includes forming a lower segment of the trench capacitor recess below the vertically arranged sequence of two or more upper segments. The method includes forming one or more interspersed layers of a trench capacitor structure within the trench capacitor recess.

As described in greater detail above, some implementations described herein provide a method. The method includes receiving, by a tool, a first delivery of a semiconductor substrate. The method includes removing, by the tool, a first amount of a substrate material as part of forming a first upper segment of a trench capacitor recess that penetrates vertically into the semiconductor substrate. The method includes removing, by the tool, a second amount of the substrate material as part of forming a second upper segment of the trench capacitor recess below the first upper segment using a first layer of a first protective material that is formed on first sidewalls of the first upper segment in an in-situ operation. The method includes receiving, by the tool, a second delivery of the semiconductor substrate after a second layer of a second protective material is formed on the first sidewalls of the first upper segment and on second sidewalls of the second upper segment in an ex-situ operation. The method includes removing, by the tool, a third amount of the substrate material as part of forming a lower segment of the trench capacitor recess below the second upper segment using the second layer of the second protective material.

As used herein, the term "and/or," when used in connection with a plurality of items, is intended to cover each of the plurality of items alone and any and all combinations of the plurality of items. For example, "A and/or B" covers "A and B," "A and not B," and "B and not A."

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a vertically arranged sequence of two or more upper segments of a trench capacitor recess using two or more cycles of a combination of operations comprising:
        performing an in-situ nitridation operation that comprises forming a first protective material on sidewalls and a temporary bottom surface of at least a first upper segment of the two or more upper segments;
        forming a second protective material on sidewalls of the two or more upper segments using an ex-situ deposition operation; and
        forming a lower segment of the trench capacitor recess below the vertically arranged sequence of two or more upper segments; and
    forming one or more interspersed layers of a trench capacitor structure within the trench capacitor recess.

2. The method of claim 1,
wherein the in-situ nitridation operation that forms the first protective material on the sidewalls of at least the first upper segment of the two or more upper segments corresponds to a plasma-flush operation that grows a layer of oxide on the sidewalls.

3. The method of claim 2,
wherein the plasma-flush operation is performed in a same processing chamber as an in-situ etch operation to form the first upper segment.

4. The method of claim 1,
wherein forming the second protective material on the sidewalls of the two or more upper segments using the ex-situ deposition operation comprises:
    forming the second protective material on the sidewalls of the two or more upper segments using an atomic layer deposition operation.

5. The method of claim 1,
wherein forming the second protective material on the sidewalls of the two or more upper segments using the ex-situ deposition operation comprises:
    forming the second protective material to a thickness that is included in a range of approximately 5 nanometers to approximately 100 nanometers.

6. The method of claim 1,
wherein forming the second protective material on the sidewalls of the two or more upper segments using the ex-situ deposition operation comprises:
    forming the second protective material on the sidewalls of the two or more upper segments using a chemical vapor deposition operation.

7. The method of claim 1,
wherein forming the second protective material on the sidewalls of the two or more upper segments using the ex-situ deposition operation comprises:
    forming a layer of a silicon nitride material or forming a layer of a silicon dioxide material.

8. The method of claim 1,
wherein the combination of operations further comprises:
    performing a first etch operation to etch through the first protective material on the temporary bottom surface; and
    performing a second etch operation to remove silicon below at least the first upper segment.

9. The method of claim 8,
wherein the first etch operation and/or the second etch operation corresponds to a reactive ion etch operation.

10. A method, comprising:
    receiving, by a tool, a first delivery of a semiconductor substrate;
    removing, by the tool, a first amount of a substrate material as part of forming a first upper segment of a trench capacitor recess that penetrates vertically into the semiconductor substrate;
    removing, by the tool, a second amount of the substrate material as part of forming a second upper segment of the trench capacitor recess below the first upper segment using a first layer of a first protective material that is formed on first sidewalls of the first upper segment in an in-situ nitridation operation;
    receiving, by the tool, a second delivery of the semiconductor substrate after a second layer of a second protective material is formed on the first sidewalls of the first upper segment and on second sidewalls of the second upper segment in an ex-situ operation; and
    removing, by the tool, a third amount of the substrate material as part of forming a lower segment of the trench capacitor recess below the second upper segment using the second layer of the second protective material.

11. The method of claim 10,
wherein a thickness of the first layer of the first protective material is included in a range of approximately 1 nanometer to approximately 7 nanometers.

12. The method of claim 10,
wherein removing the second amount of the substrate material as part of forming the second upper segment of the trench capacitor recess that penetrates vertically into the semiconductor substrate comprises:
    performing a first etch operation to etch through a bottom portion of the first layer of the first protective material such that the first layer of the first protective material remains on the first sidewalls of the first upper segment; and performing a second etch operation after the first etch operation to remove the second amount of the substrate material as part of forming the second upper segment, wherein the first layer of the first protective material remaining on the first sidewalls of the first upper segment protects the first upper segment from being etched in the second etch operation, and wherein a combination of the first etch operation and the second etch operation results in formation of a transition structure between the first upper segment and the second upper segment that extends horizontally towards the trench capacitor recess.

13. The method of claim 12, wherein the transition structure corresponds to a first transition structure and removing the third amount of the substrate material as part of forming the lower segment of the trench capacitor recess that penetrates vertically into the semiconductor substrate comprises:

performing a third etch operation to etch through a bottom portion of the second layer of the second protective material such that the second layer of the second protective material remains on the first sidewalls of the first upper segment and second sidewalls of the second upper segment; and performing a fourth etch operation after the third etch operation to remove the third amount of the substrate material as part of forming the lower segment, wherein the second layer of the second protective material remaining on the first sidewalls of the first upper segment and the second sidewalls of the second upper segment protects the first upper segment and the second upper segment from being etched in the second etch operation, and wherein a combination of the third etch operation and the fourth etch operation results in formation of a second transition structure between the second upper segment and the lower segment that extends horizontally towards the trench capacitor recess.

14. The method of claim 13, further comprising:

forming a spacer layer of a trench capacitor structure in the trench capacitor recess, wherein forming the spacer layer comprises:

forming the spacer layer on the first transition structure and on the second transition structure.

15. The method of claim 14, further comprising:

forming an electrode layer of the trench capacitor structure in the trench capacitor recess wherein forming the electrode layer comprises:

forming the electrode layer on the spacer layer, over the first transition structure, and over the second transition structure.

16. A method, comprising:

forming a first upper segment of a trench capacitor recess that penetrates vertically into a semiconductor substrate;

forming a second upper segment of the trench capacitor recess below the first upper segment using a first layer of a first protective material that is formed on first sidewalls of the first upper segment in an in-situ nitridation operation;

forming a second layer of a second protective material on the first sidewalls of the first upper segment and on second sidewalls of the second upper segment in an ex-situ operation; and forming a lower segment of the trench capacitor recess below the second upper segment using the second layer of the second protective material.

17. The method of claim 16, further comprising:

forming a transition structure between the first upper segment and the second upper segment that extends horizontally towards the trench capacitor recess.

18. The method of claim 17, wherein the transition structure corresponds to a first transition structure, the method further comprising:

forming a second transition structure between the second upper segment and the lower segment that extends horizontally towards the trench capacitor recess.

19. The method of claim 18, further comprising forming, in the trench capacitor recess, a spacer layer, of a trench capacitor structure, on the first transition structure and the second transition structure.

20. The method of claim 19, further comprising:

forming an electrode layer of the trench capacitor structure in the trench capacitor recess wherein forming the electrode layer comprises:

forming the electrode layer on the spacer layer, over the first transition structure, and over the second transition structure.

\* \* \* \* \*